(12) United States Patent  
Bergendahl et al.

(10) Patent No.: US 9,184,042 B1  
(45) Date of Patent: Nov. 10, 2015

(54) WAFER BACKSIDE PARTICLE MITIGATION

(71) Applicant: International Business Machines Corporation, Armonk, NY (US)

(72) Inventors: Marc A. Bergendahl, Troy, NY (US); James J. Demarest, Rensselaer, NY (US); Alex R. Hubbard, East Greenbush, NY (US); Richard Johnson, Albany, NY (US); Ryan O. Jung, Rensselaer, NY (US); James J. Kelly, Schenectady, NY (US); Sanjay C. Mehta, Niskayuna, NY (US); Alexander Reznicek, Troy, NY (US); Allan W. Upham, Waterford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/459,809

(22) Filed: Aug. 14, 2014

(51) Int. Cl.  
*H01L 21/00* (2006.01)  
*H01L 21/31* (2006.01)  
*H01L 21/461* (2006.01)  
*H01L 21/02* (2006.01)  
*H01L 21/027* (2006.01)  
*H01L 21/56* (2006.01)

(52) U.S. Cl.  
CPC ...... *H01L 21/02016* (2013.01); *H01L 21/0274* (2013.01); *H01L 21/561* (2013.01)

(58) Field of Classification Search  
CPC ............... H01L 21/02016; H01L 21/0274; H01L 21/561; H01L 21/6831; H01L 21/67225; H01L 21/68707

USPC ......... 438/456, 458, 464, 465, 476, 703, 758, 438/759; 257/E21.002, E21.023, E21.214  
See application file for complete search history.

(56) References Cited

U.S. PATENT DOCUMENTS

| | | | |
|---|---|---|---|
| 6,413,321 B1 | 7/2002 | Kim et al. | |
| 6,881,264 B2 | 4/2005 | Hiatt et al. | |
| 6,884,717 B1 | 4/2005 | Desalvo et al. | |
| 6,998,344 B2 | 2/2006 | Akram et al. | |
| 7,056,812 B2 | 6/2006 | Derderian et al. | |
| 7,098,152 B2 | 8/2006 | Moore | |
| 7,446,045 B2 | 11/2008 | Matsumoto | |
| 7,556,712 B2 | 7/2009 | Yi et al. | |
| 7,781,343 B2 | 8/2010 | Letz et al. | |
| 2003/0045131 A1 | 3/2003 | Verbeke et al. | |
| 2004/0079385 A1* | 4/2004 | Frisa et al. | 134/1 |
| 2006/0124155 A1* | 6/2006 | Suuronen et al. | 134/33 |
| 2009/0212397 A1 | 8/2009 | Tuttle | |
| 2013/0020682 A1 | 1/2013 | Clark et al. | |
| 2013/0092186 A1* | 4/2013 | Lin et al. | 134/6 |

* cited by examiner

*Primary Examiner* — Mohsen Ahmadi  
(74) *Attorney, Agent, or Firm* — Law Offices of Ira D. Blecker, P.C.

(57) ABSTRACT

A method of particle mitigation which includes obtaining a semiconductor wafer having a nonfunctional backside and a functional frontside on which semiconductor devices are formed by one or more lithography processes; coating the backside with a mitigating layer comprising silicon or amorphous carbon; patterning the mitigating layer to form indentations in the mitigating layer; placing the semiconductor wafer onto a wafer chuck such that the wafer chuck makes direct contact with the coated and patterned backside mitigating layer; and while maintaining the coated and patterned backside mitigating layer in direct contact with the wafer chuck, performing a first lithographic process on the frontside.

17 Claims, 3 Drawing Sheets

WAFER BACKSIDE PARTICLE MITIGATION

RELATED APPLICATION

This application is related to U.S. patent application Ser. No. 14/459,745, entitled "WAFER BACKSIDE PARTICLE MITIGATION", filed even date herewith.

BACKGROUND

The present exemplary embodiments relate to mitigating particle contamination on the backside of a semiconductor wafer, and more particularly, relate to mitigating particle contamination by providing a patterned surface on the backside of the semiconductor wafer to capture the contaminating particulate matter within the patterned features.

Particulate matter may be generated from wafer handling devices (such as pics, pins and pads) as the semiconductor wafers travel through a multitude of tools in the line. Some particulate matter, and especially scratches and dents, are inevitable, regardless of any sort of preemptive cleaning or wiping methods.

The semiconductor wafers are typically handled with a so-called wafer chuck, one example of a wafer chuck being an electrostatic wafer chuck, which secures the semiconductor wafer during processing. However, conventional electrostatic chucks maintain a high percent point of contact with the backside of the semiconductor wafer. This large area of contact is highly susceptible to semiconductor wafer backside particulate manner and scratches, which can create wafer topography during lithography exposure and lead to "hot spots". A hot spot in the present context is a lithography term for a localized pattern distortion (i.e., defocus) of which one cause is wafer topography.

BRIEF SUMMARY

The various advantages and purposes of the exemplary embodiments as described above and hereafter are achieved by providing, according to a first aspect of the exemplary embodiments, a method of particle mitigation which includes obtaining a semiconductor wafer having a nonfunctional backside and a functional frontside on which semiconductor devices are formed by one or more lithography processes; coating the backside with a mitigating layer comprising silicon or amorphous carbon; patterning the mitigating layer to form indentations in the mitigating layer; placing the semiconductor wafer onto a wafer chuck such that the wafer chuck makes direct contact with the coated and patterned backside mitigating layer; and while maintaining the coated and patterned backside mitigating layer in direct contact with the wafer chuck, performing a first lithographic process on the frontside.

According to a second aspect of the exemplary embodiments, there is provided a method of particle mitigation which includes obtaining a semiconductor wafer having a nonfunctional backside and a functional frontside on which semiconductor devices are formed by one or more lithography processes; coating the backside with a mitigating layer comprising silicon or amorphous carbon; patterning the mitigating layer to form indentations in the mitigating layer; placing the semiconductor wafer onto an electrostatic wafer chuck such that the electrostatic wafer chuck makes direct contact with the coated and patterned backside mitigating layer; and while maintaining the coated and patterned backside mitigating layer in direct contact with the electrostatic wafer chuck, performing an extreme ultraviolet (EUV) lithographic process on the frontside.

According to a third aspect of the exemplary embodiments, there is provided a method of particle mitigation which includes obtaining a semiconductor wafer having a nonfunctional backside and a functional frontside on which semiconductor devices are formed by one or more lithography processes; coating the backside with a first mitigating layer comprising silicon or amorphous carbon; patterning the first mitigating layer to form indentations in the first mitigating layer; coating the first mitigating layer with a stop layer wherein the stop layer is compositionally different than the first mitigating layer; coating the stop layer with another mitigating layer comprising silicon or amorphous carbon; patterning the another mitigating layer to form indentations in the another mitigating layer; repeating, a predetermined number of times, coating the another mitigating layer with a stop layer, coating the stop layer with a next another mitigating layer comprising silicon or amorphous carbon, and patterning the next another mitigating layer to form indentations in the next another mitigating layer; placing the semiconductor wafer onto a wafer chuck such that the wafer chuck makes direct contact with the coated and patterned backside; and while maintaining the coated backside in direct contact with the wafer chuck, performing a first lithographic process on the frontside.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 3 to 5 illustrate a first exemplary process of particle mitigation in which:

FIG. 3 is a cross sectional view of FIG. 2 showing a backside coating on the semiconductor wafer;

FIG. 4 is a cross sectional view illustrating the semiconductor wafer of FIG. 3 in which the backside coating is patterned to form indentations in the backside coating; and FIG. 5 is a cross sectional view illustrating the semiconductor wafer of FIG. 4 being placed on an electrostatic chuck and a lithography process being performed on the frontside of the semiconductor wafer.

FIGS. 6 to 8 illustrate a second exemplary process of particle mitigation in which:

FIG. 6 is a cross sectional view illustrating a protective coating formed on the frontside of the semiconductor wafer;

FIG. 7 is a cross sectional view illustrating a backside coating on the semiconductor wafer of FIG. 6; and FIG. 8 is a cross sectional view illustrating the semiconductor wafer of FIG. 7 in which the backside coating is patterned to form indentations in the backside coating.

DETAILED DESCRIPTION

Semiconductor technology is well known. Through semiconductor fabrication processes, semiconductor devices are formed on a semiconductor wafer. A typical semiconductor wafer has a back, nonfunctional side (hereafter "backside") and a front, functional side (hereafter "frontside"). The semiconductor fabrication processes such as front end of the line processes to form transistors and back end of the line processes to form interconnects occur on the frontside of the semiconductor wafer. Lithography may be used in many of these semiconductor fabrication processes to pattern the frontside. Optical lithography, immersion lithography, ultraviolet (UV) lithography and extreme ultraviolet (EUV) lithography being examples of types of lithographic processes that may be utilized.

During these semiconductor fabrication processes, the semiconductor wafer may be supported by a wafer chuck such as an electrostatic wafer chuck. Electrostatic wafer chucks employ a platen with integral electrodes which are biased with high voltage to establish an electrostatic holding force between the platen and wafer, thereby "chucking" the wafer. The semiconductor wafer is typically placed backside down on the wafer chuck since the backside has no semiconductor devices and is thus nonfunctional.

As noted previously, particulate matter and scratches on the backside can cause problems such as lithographic "hotspots" and so it is desirable to mitigate the harmful effect of such particulate matter and scratches.

Figure 1:
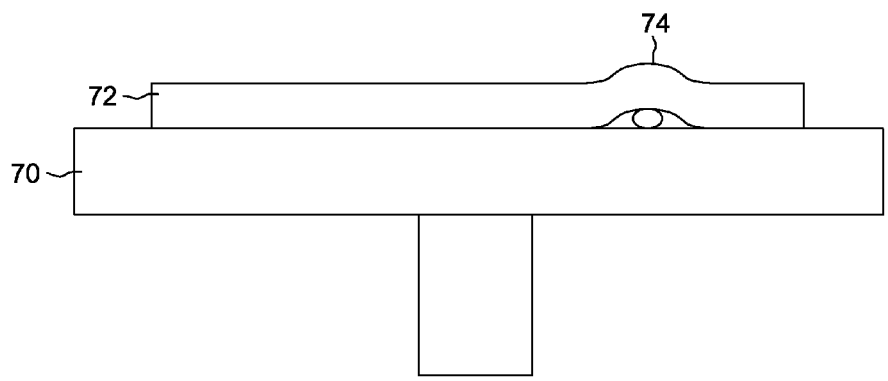
FIG. 1 is a view of a semiconductor wafer on a wafer chuck and having particulate matter between the semiconductor wafer and the wafer chuck.

Referring to the Figures in more detail, and particularly referring to FIG. 1, there is illustrated a wafer chuck 70 on which is placed a conventional semiconductor wafer 72. Between the wafer chuck 70 and the semiconductor wafer 72, there is particulate matter 74 which may distort the semiconductor wafer and lead to hotspots. The distortion of the semiconductor wafer in FIG. 1 is somewhat exaggerated for effect.

Figure 2:
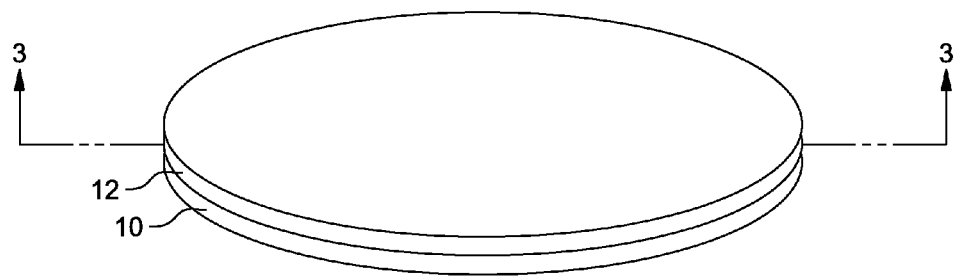
FIG. 2 is a perspective view of a semiconductor wafer according to the exemplary embodiments having a coating on the backside of the semiconductor wafer.

Referring now to FIG. 2, there is illustrated a semiconductor wafer 10 having a coating 12 on the backside of the semiconductor wafer. The coating 12 may also be referred to as a mitigating layer.

It may be desirable to have the semiconductor 10 undergo a cleaning process prior to applying the coating 12 in order to remove as many particulate matter as possible. This cleaning process may be a conventional cleaning process such as a wet cleaning process or a dry cleaning process where the wafer may be wiped to remove the particulate matter. It is believed that in many cases, the exemplary embodiments may be desirable since there may be incomplete removal of the particulate matter during any cleaning process and in any case, scratches may not be removed by cleaning. In one exemplary embodiment, the particulate matter and scratches may be characterized before applying the coating 12 to determine if the coating 12 is desirable.

Figure 3:
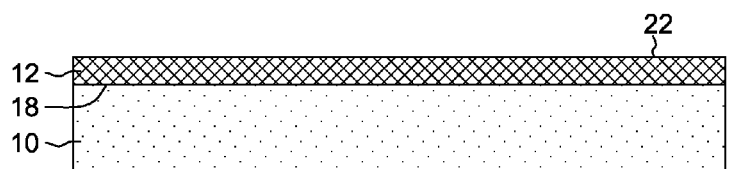

FIG. 3 is a cross sectional view of FIG. 1 in the direction of arrows 3-3 shown in FIG. 3.

A coating 12 has been applied to the backside 18 of the semiconductor wafer. The frontside of the semiconductor wafer is indicated by reference number 20. The coating 12 may be deposited or applied by a spin on film process. In one exemplary embodiment the coating 12 may be silicon, such as amorphous silicon. In an alternative embodiment, the coating 12 may be an amorphous carbon film. Both of the silicon and amorphous carbon films may be planarized and may also be removed selectively using a wet process or a dry process such as a reactive ion etching process or some combination thereof. In one exemplary embodiment, TEOS (tetraethyl orthosilicate) for the silicon film or acetylene, ethylene or propylene for the amorphous carbon film may be applied by a spin on process at a temperature that is compatible with any frontside films, for example, 250 to 600° C., to turn the spin on film into silicon or amorphous carbon. For backside deposition, the processing should be performed in a single wafer chamber.

If the surface 22 of coating 12 is uneven, the coating 12 may undergo a planarizing process to planarize the surface 22 of the coating 12. For purposes of illustration and not limitation, the planarizing process may be a chemical-mechanical planarizing process (CMP).

Figure 4:
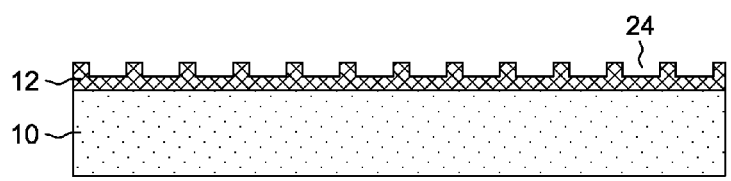

Referring now to FIG. 4, coating 12 has been patterned to form indentations 24 (may also be called dimples) in the coating 12. The patterning may be by any subtractive process such as wet etching or reactive ion etching. The pattern that is formed to result in indentations 24 may be any pattern of indentations 24 such as a grid pattern, stipple pattern, concentric ring pattern or radial pattern. The choice of pattern may also be influenced/guided by the aforementioned backside particulate characterization which may influence, for example, the pattern location, its shape and its density.

Coating 12 may have a thickness that may be selected to be on the order of at least about two times the size of the maximum targeted particle size. For example, typical particle sizes range from 0-10 um so the layer thickness may be on the order of 20 um. The indentations 24 may be sized so as to capture the particulate matter that is likely to be present. For purposes of illustration and not limitation, each of the indentations may have a width of about 10 um and a depth of about 10 um to accommodate at least a full particle. However, the size of the indentations is highly dependant on the particular target particle size, but the indentation should easily accommodate at least a full particle and so may be larger or smaller than 10 um by 10 um.

Figure 5:
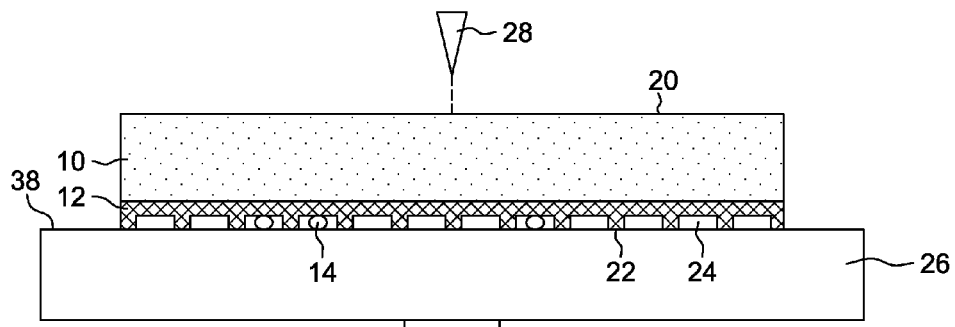

Referring now to FIG. 5, the semiconductor wafer 10 is flipped over so as to be supported on a wafer chuck 26, such as an electrostatic chuck. Frontside surface 20 of the semiconductor wafer 10 (now with the frontside surface 20 facing up) may then undergo a lithographic process such as by lithographic tool 28. Most preferably, the lithographic process is an EUV process in which extreme ultraviolet light (around 13.5 nanometers in wavelength) is used for exposing a photoresist. Surface 22 of coating 12 is now in direct contact with surface 38 of wafer chuck 26.

It is noted that since the particulate matter 14 is fully captured by coating 12, and there is even topography due to the fact that the particulate matter 14 is not wedged underneath the backside surface 18 of the semiconductor wafer 10, the semiconductor wafer 10 may be processed without fear of hotspots. That is, the patterned surface 22 of coating 12 greatly reduces the points of contact between the coating 12 and wafer chuck 26 and allows particulate matter to fall into the spaces created by the indentations 24, thus reducing debris generated topography and hot spots.

Later in the process flow, the coating 12 may be removed by conventional means such as by reactive ion etching, wet etching or chemical-mechanical polishing, depending on the specific film chosen.

Figure 6:
Figure 7:
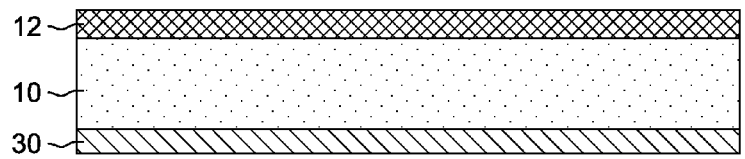
Figure 8:
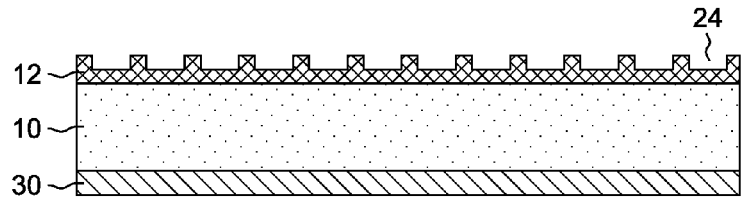

Referring now to FIGS. 6 to 8, another exemplary embodiment will be described. In this exemplary embodiment, a protective coating 30 may be applied to the frontside 20 of the semiconductor wafer 10 to avoid any possible harm to the frontside 20 when the backside coating 12 is applied. In a preferred exemplary embodiment, a protective coating may not be required, but if it is required (for instance when the exposed frontside cannot be mechanically contacted to the wafer chuck without damaging the frontside film stack), then the protective coating 30 may need to be applied, and the material for such protective coating may need to be chosen with special consideration with respect to the choice of backside pattern material as chosen above, so as to allow selective removal in subsequent processes. The frontside coating 30 may also be silicon or amorphous carbon. The frontside coating 30 may be the same or different than the coating 12.

As shown in FIG. 6, protective coating 30 has been applied to the frontside 20 of the semiconductor wafer 10.

Coating 12 may be applied as described previously to the backside 18 to capture the particulate matter 14, as shown in FIG. 7, followed by patterning to result in the structure shown in FIG. 8. Coating 12 has been formed with indentations 24 to capture particulate matter.

Figure 9:
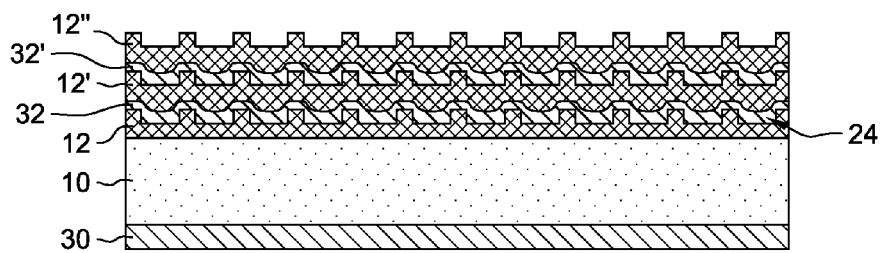
FIG. 9 illustrates a third exemplary embodiment of particle mitigation in which the backside of the semiconductor wafer of FIG. 8 is coated with a plurality of layers.

Another exemplary embodiment is illustrated in FIG. 9. In the exemplary embodiment illustrated in FIG. 9, multiple layers of coating 12 may be applied to the backside 18. The coating 12 may be applied and patterned, as described previously. Thereafter, a stop layer 32 such as an oxide may be applied to the coating 12 and planarized. The stop layer 32 may partially or entirely fill the indentations 24 which is not an issue since the stop layer 32 may eventually be removed as described below. The stop layer 32 may have a thickness of about 20 to 100 nm. The stop layer 32 provides a method of removing the exposed patterned layer selective to another patterned layer deeper in the stack. The stop layer 32 stops the removal of one patterned layer selective to the stop layer. Any material that is compatible with being deposited alternately with the patterned coating 12 as well as providing a selective stop against the patterning coating 12 may be used as the stop layer 32. For example, if the patterned coating 12 is silicon, then the stop layer 32 may be an oxide or nitride if the removal process of the silicon is reactive ion etching. If using a wet etching process, hot ammonia will etch silicon selective to oxide, for example. Then the stop layer 32 may be removed by a process selective to the underlying coating 12. For example, if the coating 12 is silicon and the stop layer 32 is oxide, then the oxide stop layer 32 may be removed, for example, by a fluorine-based reactive ion etching process or dilute HF. Since the stop layer 32 may be completely removed, it is not concerning that the stop layer 32 may partially or entirely fill the indentations 24.

Then another coating 12' may applied to the stop layer 32 and patterned. This process sequence may be repeated until subsequent stop layer 32' and coating 12" have been formed as shown in FIG. 9. Additional stop layers and coatings may be applied until the desired number of stop layers and coatings have been added. All of the stop layers 32, 32' may comprise the same material or different materials. Similarly, all of the coatings 12, 12', 12" may comprise the same material or different materials.

The method of alternating patterned layers separated by stop layers provides a stack of "pre-built" patterned films that may be iteratively removed as needed, without the need to go through as many iterative deposition steps. That is, the last coating 12, 12' or 12" may be removed followed by removal of the last stop layer 32' or 32 so that the next coating 12 or 12' is ready to encapsulate any particulate matter 14 in the next lithographic process, such as an EUV process. There may be cases where one is prohibited from depositing such a patterned layer prior to EUV exposure due to exposed films, etc. where having several "pre-built" layers can serve the needed purpose of entrapping particles that may be present either on the backside of the semiconductor wafer or the wafer chuck within the indentations 24 of the coating 12.

The frontside protective coating 30, while shown in FIG. 9, is optional and may be dispensed with if desired.

Figure 10:
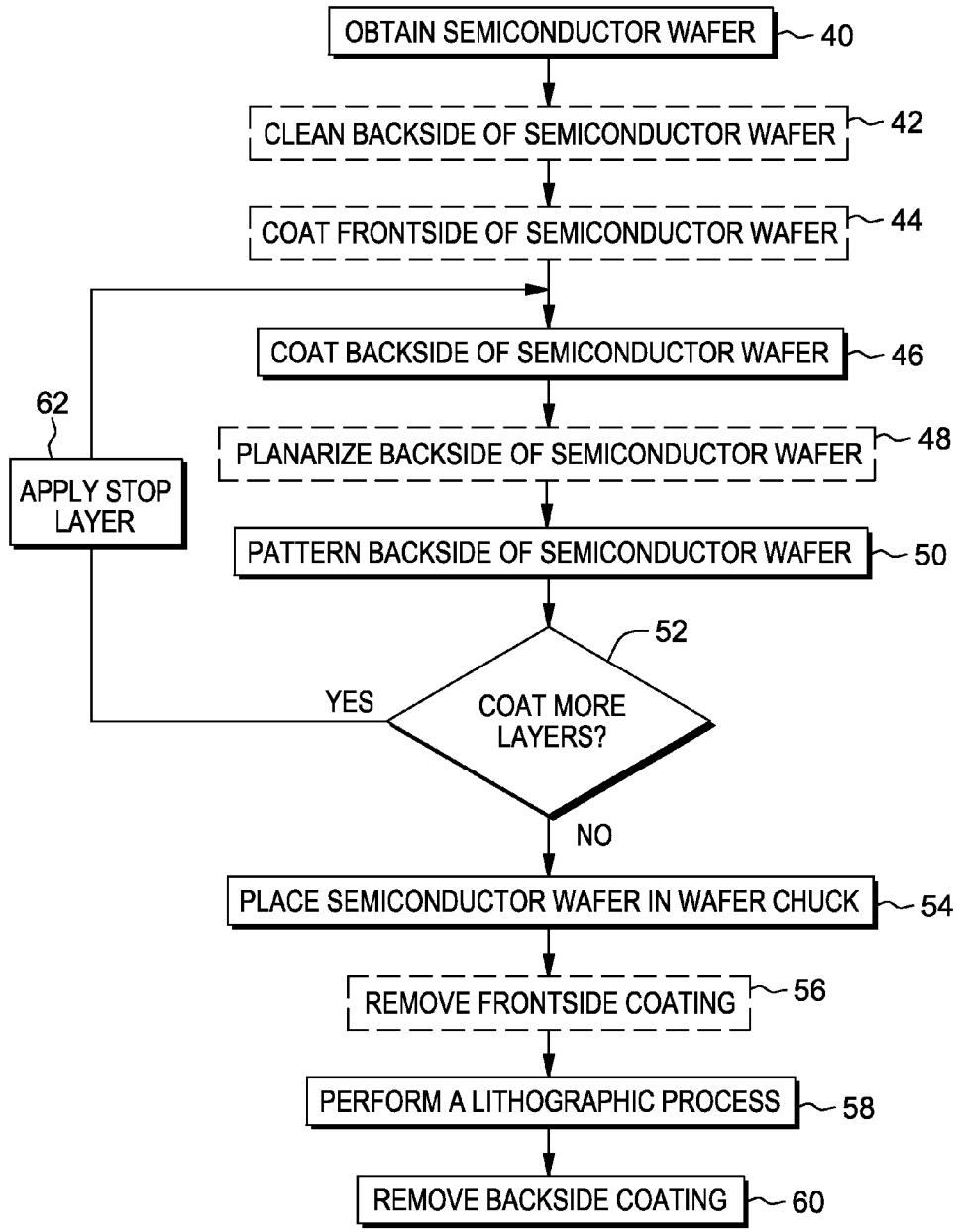
FIG. 10 is a flow chart illustrating a process for forming the exemplary embodiments.

Referring now to FIG. 10, there is illustrated a process flow for the various exemplary embodiments. The process begins by obtaining a semiconductor wafer, box 40.

In an optional process, the backside of the semiconductor wafer may be cleaned to remove as many particulate matter as possible, box 42. Optionally also, the backside of the semiconductor wafer may be characterized to determine if the patterned coating is desirable.

In another optional process, the frontside of the semiconductor wafer may receive a protective coating to protect the frontside during subsequent application of the backside coating, box 44. The frontside protective coating would have to be removed prior to performing any lithographic process on the frontside.

The backside of the semiconductor wafer may be coated, box 46, by any of the processes and materials described previously.

If the surface of the backside coating is uneven, in an optional process, the backside coating may then be planarized, box 48.

The backside coating may then be patterned to form indentations (or dimples) as described previously, box 50.

It is then determined if more backside layers are to be applied, box 52. The additional backside layers may be those described with respect to FIG. 9. If more layers are to be applied, a stop layer may be applied such as stop layer 32 in FIG. 9, box 62, then the process returns to box 46 to apply additional coating layers. If no more layers are to be applied, the process proceeds to place the coated semiconductor wafer on the wafer chuck, box 54. It is preferred that the wafer chuck be an electrostatic wafer chuck. The backside coating is placed in direct contact on the wafer chuck.

If the semiconductor wafer has a frontside protective coating, the frontside coating may be removed, box 56, before or after the semiconductor wafer is placed on the wafer chuck. In any event, the frontside protective coating must be removed before a lithographic process is performed.

A lithographic process is next performed on the frontside, box 58. It is most preferred that the backside coating be present when the semiconductor wafer undergoes an EUV process as this process most likely leads to hotspots.

When lithographic processing is completed, or at least when EUV lithographic processing is completed, the backside coating may be removed, box 60.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:
1. A method of particle mitigation comprising:
   obtaining a semiconductor wafer having a nonfunctional backside and a functional frontside on which semiconductor devices are formed by one or more lithography processes;
   coating the backside with a mitigating layer comprising silicon or amorphous carbon;
   patterning the coated backside mitigating layer to form indentations in the coated backside mitigating layer;

coating the backside with a stop layer that is compositionally different than the coated and patterned backside mitigating layer, coating the stop layer with another mitigating layer comprising silicon or amorphous carbon and patterning the another mitigating layer;

placing the semiconductor wafer onto a wafer chuck such that the wafer chuck makes direct contact with the coated and patterned backside mitigating layer; and while maintaining the coated and patterned backside in direct contact with the wafer chuck, performing a first lithographic process on the frontside.

2. The method of claim 1 further comprising planarizing the coated backside mitigating layer by a planarizing process prior to patterning.

3. The method of claim 1 further comprising cleaning the backside by a cleaning process prior to coating the backside.

4. The method of claim 1 wherein the coated and patterned backside mitigating layer captures particulate matter in the indentations of the coated and patterned backside mitigating layer.

5. The method of claim 1 wherein the first lithographic process is an extreme ultraviolet (EUV) lithographic process and the wafer chuck is an electrostatic wafer chuck.

6. The method of claim 1 wherein the coated and patterned backside mitigating layer is amorphous silicon.

7. The method of claim 1 further comprising removing the coated and patterned backside mitigating layer subsequent to performing the first lithographic process.

8. The method of claim 1 further comprising:
removing the another mitigating layer and the stop layer subsequent to performing the first lithographic process;
while maintaining the coated and patterned backside in direct contact with the wafer chuck, performing a second lithographic process on the frontside; and
removing the coated backside mitigating layer subsequent to performing the second lithographic process so as to expose the semiconductor wafer.

9. The method of claim 1 further comprising repeating, at least one additional time, coating the backside with a stop layer, coating the stop layer with another mitigating layer comprising silicon or amorphous carbon and patterning the another mitigating layer.

10. The method of claim 1 further comprising coating the frontside with a protective layer.

11. The method of claim 10 further comprising removing the frontside coating prior to performing the first lithographic process.

12. A method of particle mitigation comprising:
obtaining a semiconductor wafer having a nonfunctional backside and a functional frontside on which semiconductor devices are formed by one or more lithography processes;
coating the frontside with a protective layer;
coating the backside with a mitigating layer comprising silicon or amorphous carbon;
patterning the coated backside mitigating layer to form indentations in the coated backside mitigating layer;
placing the semiconductor wafer onto an electrostatic wafer chuck such that the electrostatic wafer chuck makes direct contact with the coated and patterned backside mitigating layer;
removing the frontside coating prior to performing an extreme ultraviolet (EUV) lithographic process;
while maintaining the coated and patterned backside mitigating layer in direct contact with the electrostatic wafer chuck, performing the extreme ultraviolet (EUV) lithographic process on the frontside; and
removing the coated and patterned backside mitigating layer subsequent to performing the EUV lithographic process.

13. The method of claim 12 wherein the coated and patterned backside mitigating layer captures particulate matter in the indentations of the coated and patterned backside mitigating layer.

14. The method of claim 12 wherein the coated and patterned backside mitigating layer is amorphous silicon.

15. A method of particle mitigation comprising:
obtaining a semiconductor wafer having a nonfunctional backside and a functional frontside on which semiconductor devices are formed by one or more lithography processes;
coating the backside with a first mitigating layer comprising silicon or amorphous carbon;
patterning the first mitigating layer to form indentations in the first mitigating layer;
coating the first mitigating layer with a stop layer wherein the stop layer is compositionally different than the first mitigating layer;
coating the stop layer with another mitigating layer comprising silicon or amorphous carbon;
patterning the another mitigating layer to form indentations in the another mitigating layer;
repeating, a predetermined number of times, coating the another mitigating layer with the stop layer, coating the stop layer with a next another mitigating layer comprising silicon or amorphous carbon, and patterning the next another mitigating layer to form indentations in the next another mitigating layer;
placing the semiconductor wafer onto a wafer chuck such that the wafer chuck makes direct contact with the coated and patterned backside;
while maintaining the coated and patterned backside in direct contact with the wafer chuck, performing a first lithographic process on the frontside;
removing the next another mitigating layer; and
removing the stop layer directly adjacent to the next another mitigating layer so as to expose an underlying mitigation layer which is the next another mitigating layer, the another mitigating layer or the first mitigating layer.

16. The method of claim 15 wherein after performing the first lithographic process, further comprising:
placing the semiconductor wafer onto a wafer chuck such that the wafer chuck makes direct contact with the next another mitigating layer, the another mitigating layer or the first mitigating layer, as the case may be; and
while maintaining the coated and patterned backside in direct contact with the wafer chuck, performing a second lithographic process on the frontside; and
subsequent to performing the second lithographic process, removing all of the next another mitigating layer, the another mitigating layer and the first mitigating layer so as to expose the semiconductor wafer.

17. The method of claim 15 further comprising coating the frontside with a protective layer.

* * * * *